Figure 1:
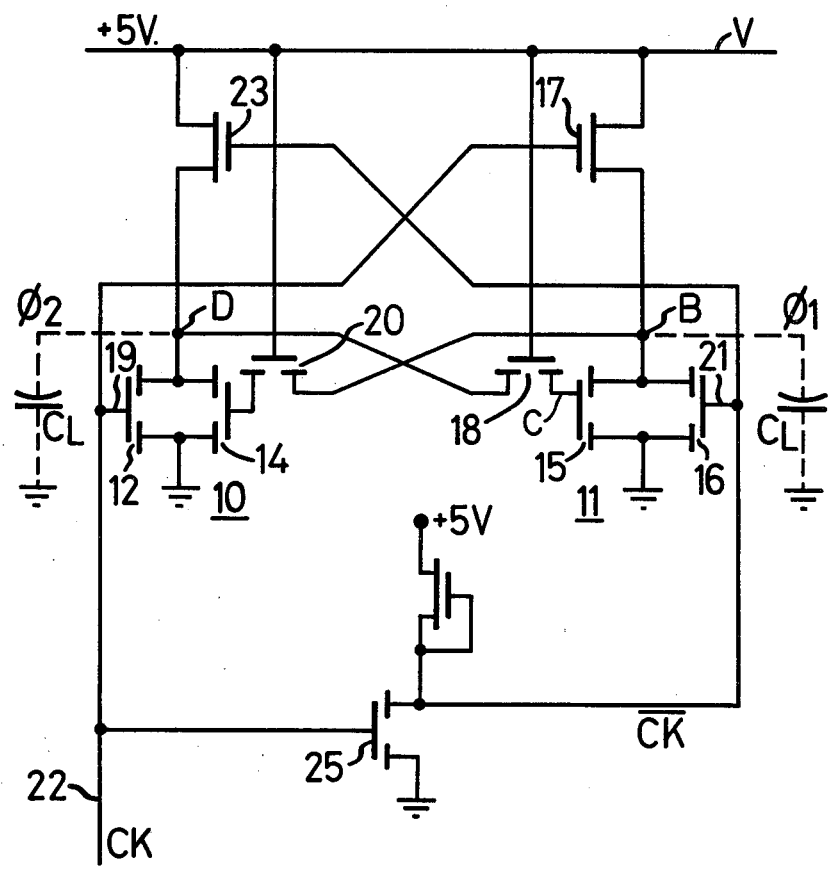

United States Patent [19]

White

[11] Patent Number: 4,472,645

[45] Date of Patent: Sep. 18, 1984

[54] CLOCK CIRCUIT FOR GENERATING NON-OVERLAPPING PULSES

[75] Inventor: Lincoln D. White, Ipswich, England

[73] Assignee: British Telecommunications, London, England

[21] Appl. No.: 333,435

[22] Filed: Dec. 22, 1981

[30] Foreign Application Priority Data

Dec. 22, 1980 [GB] United Kingdom ............... 8040979

[51] Int. Cl.³ ............... H03K 3/356; H03K 5/153; H03K 17/284; H03K 17/693
[52] U.S. Cl. ............... 307/279; 307/269; 307/453; 307/601; 307/608
[58] Field of Search ............... 307/453, 452, 480, 481, 307/511, 513, 354, 355, 238.6, 246, 247 R, 583, 262, 269, 279, 291, 594, 601, 608; 328/55, 57, 63; 377/78, 79, 104, 105; 365/154, 190, 194

[56] References Cited

U.S. PATENT DOCUMENTS

| | | | |
|---|---|---|---|
| 3,292,100 | 12/1966 | Berlind | 307/262 X |
| 3,578,989 | 5/1971 | Heuner | 307/279 X |
| 3,668,436 | 6/1972 | Bacon | 307/262 |
| 3,767,945 | 10/1973 | Goser | 307/279 |
| 3,927,334 | 12/1975 | Callahan | 307/269 |
| 3,961,269 | 6/1976 | Alverez, Jr. | 307/262 X |
| 4,291,240 | 9/1981 | Rösler | 307/269 X |
| 4,388,537 | 6/1983 | Kanuma | 307/297 |

FOREIGN PATENT DOCUMENTS

| | | | |
|---|---|---|---|
| 1286101 | 1/1969 | Fed. Rep. of Germany | 307/269 |
| 2339996 | 8/1977 | France | 307/269 |

OTHER PUBLICATIONS

IBM Technical Disclosure Bulletin, vol. 22, No. 3, Aug. 1979, New York (US), B. Cassidy et al.: "Dynamic MOSFET Logic Clock Driver", pp. 1093–1094.

"Two-Phase Clock Features Nonoverlapping Outputs" by Heckt, Electronics, Jan. 20, 1977, p. 99.

Primary Examiner—Larry N. Anagnos
Assistant Examiner—David R. Hudspeth
Attorney, Agent, or Firm—Cushman, Darby & Cushman

[57] ABSTRACT

A clock generator for producing a two phase output comprises a bistable circuit having two stages. The output of each stage is cross coupled to the input of the other and each cross coupling path includes a high-resistance transfer gate. Each transfer gate forms part of an RC delay element which is so arranged that at a transition of clock signals the output of one of the stages completes its transition substantially at the same time as the output of the other stage begins its transition. This results in non-overlapping outputs from the generator.

6 Claims, 4 Drawing Figures

CLOCK CIRCUIT FOR GENERATING NON-OVERLAPPING PULSES

DESCRIPTION

This invention relates to electronic clock generators. In particular the invention relates to a clock generator with a two phase output.

There is a requirement in some electronic circuit applications for a two phase electronic clock generator in which the overlap between the two output phases of the generator can be controlled so that they are effectively nonoverlapping. An object of the invention is to provide a relatively simple two phase clock generator in which the two output phases are effectively non-overlapping.

According to the present invention there is provided a clock generator having a two phase output comprising a bistable circuit having two stages in which the output of each stage is cross coupled to one input of the other stage, each stage having a second input one of which is arranged to receive a clock signal, the other of which is arranged to receive the inverse of the clock signal, and wherein each cross coupling path includes an RC delay element which is so arranged that at a transition of said clock signals the output of one of said stages completes its transition substantially at the same time as the output of the other stage begins its transition. The RC elements are arranged so that they are effective on alternate clock transitions, only one being effective at any given transition. By appropriately selecting the delays provided by the RC elements it is possible to generate a two phase clock output in which the two phases are effectively non-overlapping.

Each stage of the bistable circuit may comprise a pair of NOR gates. Each NOR gate may comprise a pair of MOS transistors with a common load transistor. Each cross coupling path may include a high resistance transfer MOS transistor which provides the resistance of the RC element, the capacitance being provided by the gate of one of the MOS transistors of the NOR gate.

A feature of the present invention is that one of said load transistors may be arranged to be driven by the clock signal and the other by the inverse of the clock signal.

The present invention is particularly suitable for fabrication in MOS5V N-channel technology.

Figure 2:
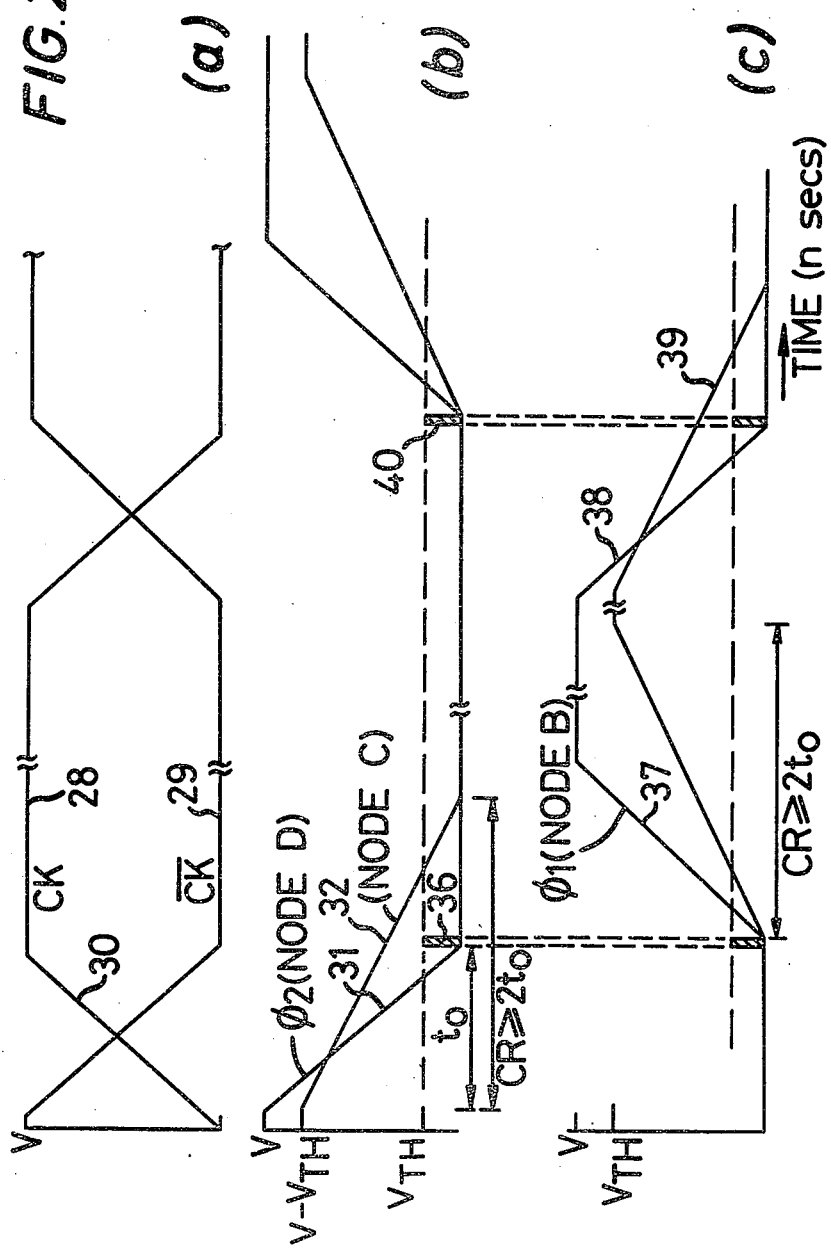
Figure 3:
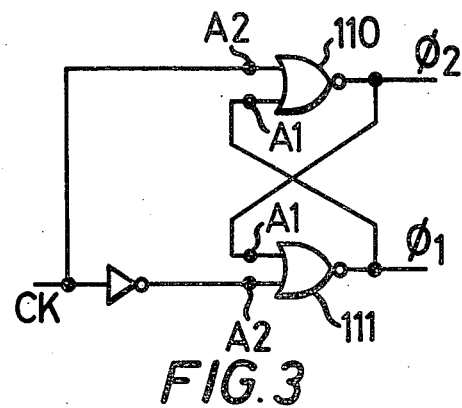
Figure 4:
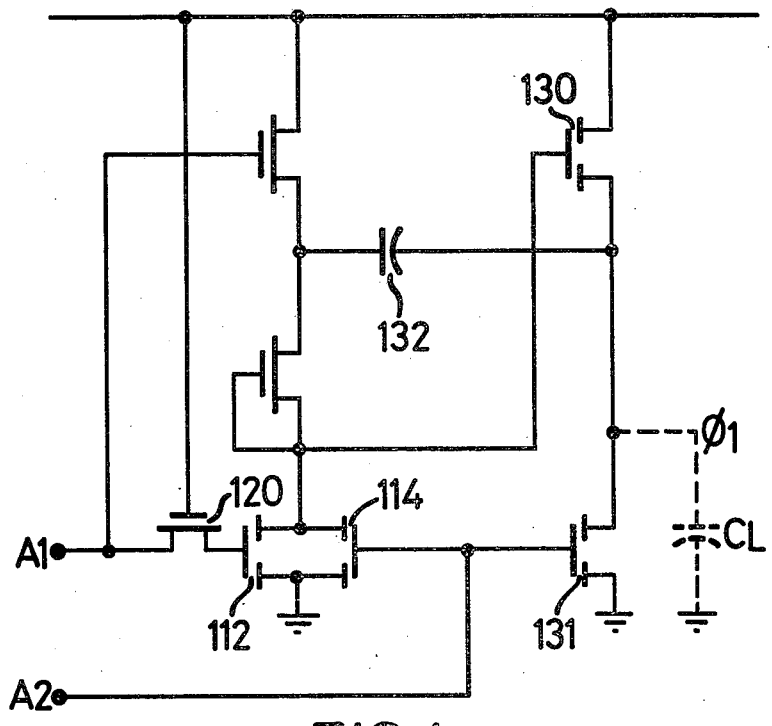

The invention will be described now by way of example only with particular reference to the accompanying drawings. In the drawings:

FIG. 1 is a circuit diagram of a clock generator in accordance with the present invention, FIGS. 2(a) to 2(c) are waveform diagrams illustrating the waveforms at various points in the circuit of FIG. 1, and FIGS. 3 and 4 illustrate another embodiment of a clock generator in accordance with the present invention.

Referring to FIG. 1 a two phase clock generator comprises a basic bistable circuit formed from a pair of NOR gates 10 and 11. The NOR gate 10 comprises a pair of MOS transistors 12, 14 which have a common load transistor 23 and the NOR gate 11 comprises a pair of MOS insulating field effect transistors 15, 16 which have a common load transistor 17. The output from the NOR gate 10 is coupled to an input gate of the NOR gate 11 by way of a high resistance transfer MOS transistor 18 and the output from the NOR gate 11 is coupled to an input gate of the NOR gate 10 by way of a high resistance transfer MOS transistor 20. The gates of the MOS transistors 18 and 20 are each connected to supply line V which is set at +5 volts.

It will thus be seen that the cross coupling paths of the bistable circuit each include an RC element in which the resistance is provided by the MOS transistor 18, 20 and the capacitance is provided by the gate of the MOS transistor 14, 15 of the NOR gate.

The other input 19 to the NOR gate 10 is from a source of clock signals by way of a line 22 and the other input 21 to the NOR gate 11 is the inverted clock signal, the inversion being carried out by a transistor 25. It will be noted that the gate of the load transistor 17 is connected to receive the clock signal and the gate of the transistor 23 is connected to receive the inverted clock signal. With this arrangement, +5 volts is produced on the gate of a load transistor for a logic 0 to 1 transition. This means that a faster edge speed is obtained than in the case of a conventional arrangement of load transistor in which the gate and source are connected together. On the logic 1 to 0 transition, logic 0 volts is applied to the gate of the load transistor and the speed of the discharge for a given size of transistor is then dependent only on the size of the driver transistor. Overall the arrangement produces a fast edge speed with full logic swing and minimal power consumption. The output loads are represented by $C_L$.

The operation of the circuit will be described now with reference to FIG. 2. FIG. 2(a) shows the clock signal on line 22 (waveform 28) and the inverted clock signal (waveform 29) applied to one input of the NOR gate 11. Considering the situation when the clock signal 28 is low, then the node shown at D in FIG. 1 is at logic 1 and the node B of the NOR gate 15 is at logic 0 since the inverted clock signal is high. This means that the output represented by $\phi_2$ is high and the output represented by $\phi_1$ is low. The transistor 12 is constructed so that when the clock signal 28 switches from a low to a high condition as represented by the transition 30, the node D discharges to a low condition in a relatively short time as represented by the transition 31 (FIG. 2(b)). Now the transistor 18 has a relatively high resistance so that the capacitance of the gate of the transistor 15 is slow to discharge as represented by the line 32 (FIG. 2(b)). It will be noted that initially this gate is charged to a voltage of $V-V_{TH}$ where $V_{TH}$ is a typical threshold voltage for MOS logic. This means that after the gate of transistor 16 goes low due to the transition of the inverted clock signal the potential at the node B does not commence to rise appreciably because of the slow discharge of the gate of the transistor 15. If this condition exists for a period of $T_o$ nsecs after the discharge of the node D, then CR is made equal to fx $t_o$ nsecs where f is appropriately chosen to provide a delay which is such that ideally the node B begins to rise at about the same time the node D has settled to logic 0 (see waveform diagrams 2b and 2c). There is a small degree of overlap represented by shaded area 36 but this occurs at a voltage which is well below the nominal threshold voltage $V_{TH}$ of any logic circuits. Thereafter the node B rises rapidly under the dynamic pull of its associated load MOS transistor as shown by the transition 37 (FIG. 2(c)).

A similar sequence of events occur at the high to low transition of the clock signal. This is also illustrated in the waveforms of FIG. 2. It will be seen that the potential at the node B falls rapidly as shown by transition 38 by way of the transistor 16 whilst because of the high resistance provided by transistor 20 the capacitance of the gate of the transistor 14 discharges only slowly as shown by the waveform 39. The effect of this is that the potential at the node D does not start to rise until the potential at node B has reached the logic 0 level. There is a small area of overlap as represented by the shaded area 40 but again this is at a potential which is well below the threshold level.

Thus it will be see that the circuit of FIG. 1 produces a two phase clock signal in which the two phases are effectively non-overlapping. The generator is particularly suitable for driving low capacitive loads of say less than approximately 5 pf and can be implemented in MOS 5 V N-channel technology.

As described the high resistance gates 18 and 20 are enhancement-type transistors. It will be appreciated that other types of devices could be used. For example the gates could be depletion type devices in which case the transistors 14 and 15 would charge to the voltage V.

The arrangement shown in FIG. 1 is for driving low capacitive loads of typically 5 pf or less. An arrangement which can drive loads of up to 30 pf is shown in FIGS. 3 and 4. FIG. 3 shows schematically the basic bistable arrangement which comprises gate circuits 110 and 111 and produces an output having two phases $\phi_1$ and $\phi_2$. Each gate circuit 110, 111 is shown in detail in FIG. 4 and includes a pair of MOS transistors 112, 114 which operate in the manner described for transistors 12, 14 of FIG. 1. Transistor 120 is a high resistance transistor corresponding to transistor 20 of FIG. 1 to provide the RC element in the cross coupling path. The output from the other gate circuit of the bistable is received at terminal A1 and clock signals are fed to terminal A2.

It will be seen that the output of the circuit shown in FIG. 4 includes a push-pull arrangement comprising transistors 130 and 131. This arrangement gives the circuit the ability to drive the higher capacitance load. Capacitor 132 is a feedback capacitor to provide the necessary drive signals for the transistors.

I claim:

1. A clock generator having a two phase output comprising a bistable circuit having two stages in which the output of each stage is cross coupled to one input of the other stage, said one input having an input capacitance associated therewith, each stage having a second input one of which is coupled to receive a clock signal, the other of which is coupled to receive the inverse of the clock signal, characterised in that each of the two stages is formed employing insulating gate field effect transistors and the cross coupling path to said one input of each stage includes a respective series resistance element forming with the input capacitance of that stage an RC delay element which is so coupled that at a transition of said clock signals the output of one of said stages completes its transition substantially at the same time as the output of the other stage begins its transition.

2. A clock generator as claimed in claim 1 characterised in that the RC elements are coupled to produce a characteristic RC delay on alternate clock transitions, only one RC element being effective at any given transition.

3. A clock generator as claimed in claim 2 characterised in that each stage of the bistable circuit comprises a NOR gate.

4. A clock generator as claimed in claim 3 characterised in that each NOR gate comprises a pair of MOS transistors with respective sources and drains connected in parallel and with respective gate electrodes serving as a pair of inputs to the NOR gate with a common load transistor connected in series with said parallel connected sources and drains of the pair of transistors.

5. A clock generator as claimed in claim 4 characterised in that each series resistance element comprises a high resistance transfer MOS transistor having a gate electrode connected to a predetermined voltage and providing a predetermined resistance across its source-drain electrodes.

6. A clock generator as claimed in claim 4 or claim 5 characterised in that one of said load transistors is coupled to be driven by the clock signal and the other by the inverse of the clock signal.

* * * * *